United States Patent
Kelkar et al.

(10) Patent No.: US 7,728,687 B2
(45) Date of Patent: Jun. 1, 2010

(54) NEGATIVE RESISTANCE OSCILLATOR WITH ADDITIONAL BIAS CURRENT INJECTION

(75) Inventors: Ram Kelkar, South Burlington, VT (US); Anjali R. Malladi, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 695 days.

(21) Appl. No.: 11/162,966

(22) Filed: Sep. 29, 2005

(65) Prior Publication Data

US 2007/0069830 A1    Mar. 29, 2007

(51) Int. Cl.
*H03B 5/12* (2006.01)
(52) U.S. Cl. .................. 331/185; 331/117 FE; 331/167
(58) Field of Classification Search ........... 331/117 FE, 331/167, 185
See application file for complete search history.

(56) References Cited

U.S. PATENT DOCUMENTS

| | | | |
|---|---|---|---|
| 6,016,082 A * | 1/2000 | Cruz et al. ............ | 331/117 FE |
| 6,650,195 B1 | 11/2003 | Brunn et al. | |
| 6,803,829 B2 | 10/2004 | Duncan et al. | |
| 6,850,122 B2 * | 2/2005 | Ravi et al. .................... | 331/46 |
| 7,061,339 B2 * | 6/2006 | Sibrai et al. ............. | 331/117 R |
| 7,161,442 B2 * | 1/2007 | Hong et al. ............. | 331/113 R |
| 2002/0050861 A1 | 5/2002 | Nguyen et al. | |
| 2003/0128071 A1 | 7/2003 | Nguyen et al. | |
| 2004/0189388 A1 | 9/2004 | Nguyen et al. | |

* cited by examiner

*Primary Examiner*—Robert Pascal
*Assistant Examiner*—James E Goodley
(74) *Attorney, Agent, or Firm*—Schmeiser, Olsen & Watts; Riyon Harding

(57) ABSTRACT

An oscillation circuit and the method for operating the same. The circuit includes (a) an LC oscillator including an inductor and a variable capacitor; (b) first and second differentially-coupled transistors (i) electrically coupled to the LC oscillator and (ii) configured to provide negative resistance to the LC oscillator; and (c) a first current-injecting circuit (i) electrically coupled to the first differentially-coupled transistor and (ii) configured to inject a first additional electric current into the first differentially-coupled transistor so as to cause the first differentially-coupled transistor to create a first additional negative resistance to the LC oscillator; and (d) a second current-injecting circuit (i) electrically coupled to the second differentially-coupled transistor and (ii) configured to inject a second additional electric current into the second differentially-coupled transistor so as to cause the second differentially-coupled transistor to create a second additional negative resistance to the LC oscillator.

8 Claims, 4 Drawing Sheets

US 7,728,687 B2

NEGATIVE RESISTANCE OSCILLATOR WITH ADDITIONAL BIAS CURRENT INJECTION

BACKGROUND OF THE INVENTION

1. Technical Field

The present invention relates to voltage-controlled oscillators (VCO), and more specifically, to improvements to VCOs with respect to operating frequency ranges.

2. Related Art

In a conventional LC tank voltage-controlled oscillator (VCO) comprising an inductor and a variable capacitor, the operating frequency of the VCO depends on, among other things, the capacitance of the variable capacitor. It is desirable to increase the operating frequency range of the VCO. In one case, to increase the operating frequency range of the VCO, the operator can increase the capacitance of the variable capacitor. However, increasing the capacitance of the variable capacitor results in higher parasitic resistance in the VCO and this may cause the oscillation of the VCO to stop.

Therefore, there is a need for a VCO (and a method for operating the same) that can operate at a wider operating frequency range.

SUMMARY OF THE INVENTION

The present invention provides an oscillation circuit, comprising (a) an LC oscillator including an inductor and a variable capacitor electrically coupled together; (b) first and second differentially-coupled transistors (i) electrically coupled to the LC oscillator and (ii) configured to provide negative resistance to the LC oscillator; and (c) a first current-injecting circuit (i) electrically coupled to the first differentially-coupled transistor and (ii) configured to inject a first additional electric current into the first differentially-coupled transistor so as to cause the first differentially-coupled transistor to create a first additional negative resistance to the LC oscillator.

The present invention also provides an oscillation circuit, comprising (a) an LC oscillator including an inductor and a variable capacitor electrically coupled together; (b) first and second differentially-coupled transistors (i) electrically coupled to the LC oscillator and (ii) configured to provide negative resistance to the LC oscillator; and (c) a first current-injecting circuit (i) electrically coupled to the first differentially-coupled transistor and (ii) configured to inject a first additional electric current into the first differentially-coupled transistor so as to cause the first differentially-coupled transistor to create a first additional negative resistance to the LC oscillator; and (d) a second current-injecting circuit (i) electrically coupled to the second differentially-coupled transistor and (ii) configured to inject a second additional electric current into the second differentially-coupled transistor so as to cause the second differentially-coupled transistor to create a second additional negative resistance to the LC oscillator, wherein the first current-injecting circuit comprises a transistor, and wherein the second current-injecting circuit comprises a transistor.

The present invention also provides an oscillation circuit operation method, comprising providing an oscillation circuit, which includes (a) an LC oscillator comprising an inductor and a variable capacitor electrically coupled together, (b) first and second differentially-coupled transistors electrically coupled to the LC oscillator and configured to provide negative resistance to the LC oscillator, and (c) a first current-injecting circuit electrically coupled to the first differentially-coupled transistor; and using the first current-injecting circuit to inject a first additional electric current into the first differentially-coupled transistor so as to cause the first differentially-coupled transistor to create a first additional negative resistance to the LC oscillator.

The present invention provides a VCO (and a method for operating the same) that can operate at a wider operating frequency range.

DETAILED DESCRIPTION OF THE INVENTION

Figure 1:
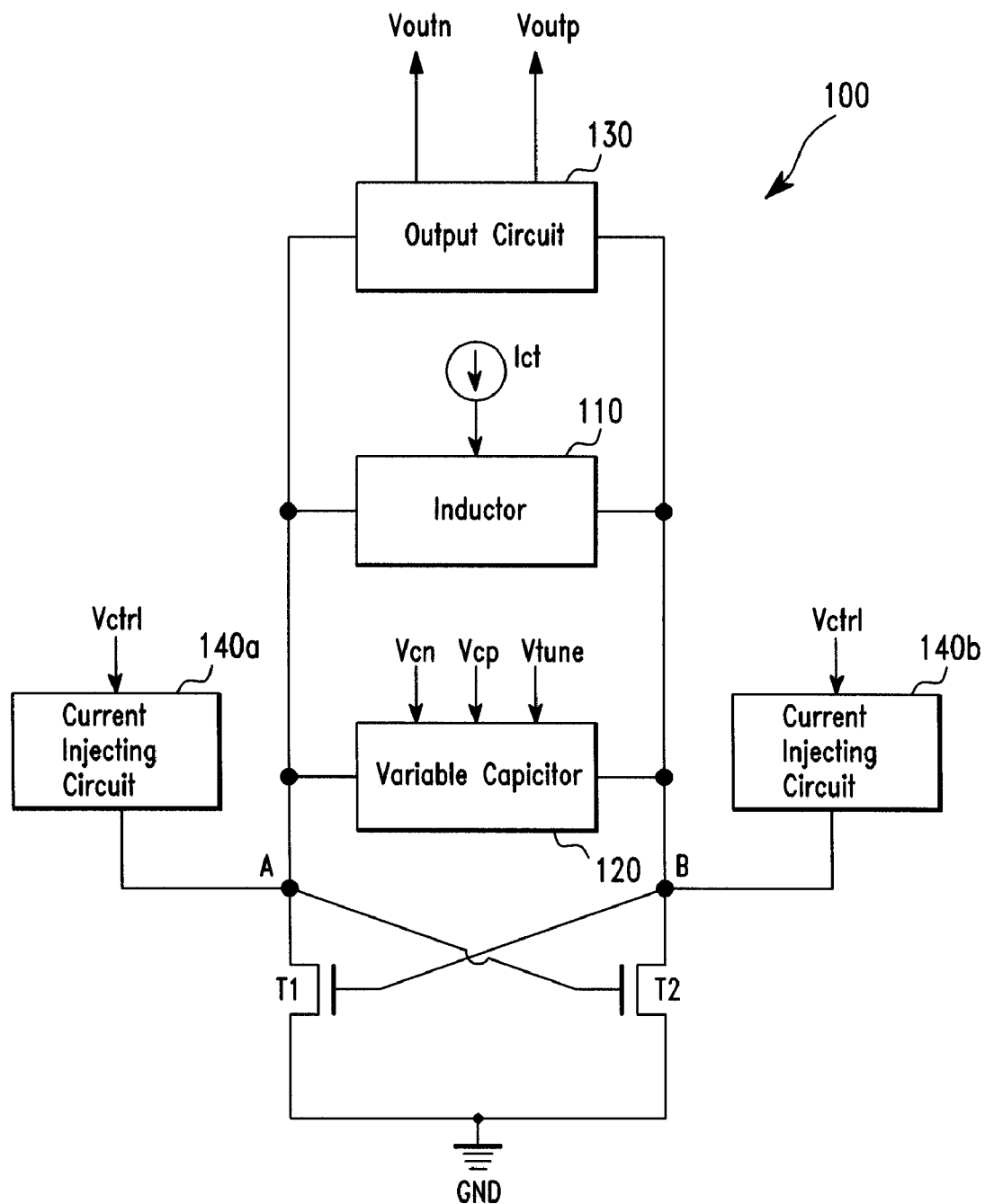
FIG. 1 shows a voltage-controlled oscillator (VCO), in accordance with embodiments of the present invention.

FIG. 1 shows a voltage-controlled oscillator (VCO) 100, in accordance with embodiments of the present invention. More specifically, in one embodiment, the VCO 100 comprises an inductor 110, a variable capacitor 120, an output circuit 130, two differentially-coupled NFETs (n-channel field effect transistors) T1 and T2, and two current-injecting circuits 140a and 140b, all electrically coupled together as shown.

Illustratively, the inductor 110 receives a center-tap electric current from a center-tab current source Ict. The center-tap electric current helps maintain the operation of the VCO 100. The variable capacitor 120 receives, illustratively, three external control signals Vcp, Vcn, and Vtune that control the capacitance of the variable capacitor 120. More specifically, the capacitance of the variable capacitor 120 can be decreased by increasing the difference between Vcp and Vcn (i.e., increasing Vcp−Vcn). The capacitance of the variable capacitor 120 can also be decreased by switching Vtune to low (e.g., 0V). Similarly, the capacitance of the variable capacitor 120 can be increased by decreasing the difference between Vcp and Vcn (i.e., decreasing Vcp−Vcn). The capacitance of the variable capacitor 120 can also be increased by switching Vtune to high (e.g., VCC).

Figure 2:
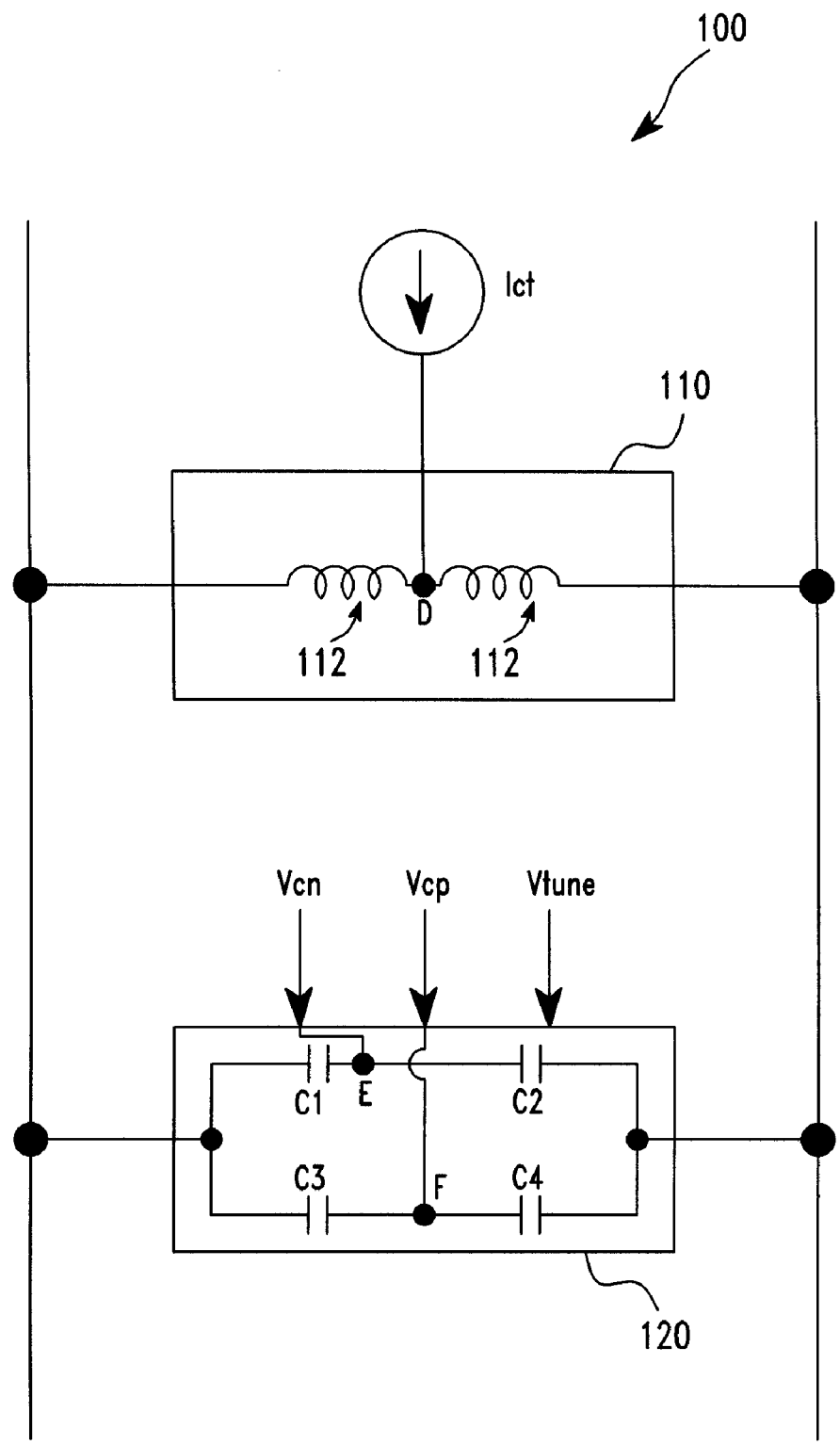
FIGS. 2-3 show embodiments of the components of the VCO of FIG. 1, in accordance with embodiments of the present invention.

FIG. 2 shows one embodiment of the inductor 110 and the variable capacitor 120 of FIG. 1. More specifically, the inductor 110 comprises a coil 112 having a center-tap node D. The current source Ict injects an electric current to node D to help maintain the operation of the VCO 100 (FIG. 1).

In one embodiment, the variable capacitor 120 comprises four capacitors C1, C2, C3, and C4. Capacitors C1 and C2 are coupled in series, and capacitors C3 and C4 are also coupled in series. The capacitors C1 and C2 are coupled in parallel to the capacitors C3 and C4. The external control signal Vcp is coupled to the common node E of the capacitors C1 and C2, whereas the external control signal Vcn is coupled to the common node F of the capacitors C3 and C4.

With reference to FIG. 1, the output circuit 130 is electrically coupled in parallel to the inductor 110 and the variable capacitor 120. In one embodiment, the output circuit 130 generates two output signals Voutn and Voutp which are also the output signals of the VCO 100.

In one embodiment, the differentially-coupled NFETs T1 and T2 provide the negative resistance to the VCO 100 necessary and sufficient to overcome the parasitic resistance of the inductor 110 and the variable capacitor 120 in a certain operating frequency range so as to help sustain the oscillation of the VCO 100 in that operating frequency range.

Assume the VCO 100 is operating at an operating frequency f1 in the operating frequency range. This means that the negative resistance created by the differentially-coupled NFETs T1 and T2 is sufficiently large to overcome the parasitic resistance of the inductor 110 and the variable capacitor 120. This sustains the operation (i.e., oscillation) of the VCO 100 at operating frequency f1.

In one embodiment, to operate the VCO 100 at a lower frequency f2 (i.e., f2<f1), the capacitance of the variable capacitor 120 is increased by, illustratively, decreasing the difference between Vcp and Vcn (i.e., decreasing Vcp−Vcn). However, increasing the capacitance of the variable capacitor 120 results in an increase in the parasitic resistance of the variable capacitor 120. If the negative resistance created by the differentially-coupled NFETs T1 and T2 is still sufficiently large to overcome the increased parasitic resistance of the VCO 100, then the oscillation of the VCO 100 at operating frequency f2 is sustained.

However, if the negative resistance created by the differentially-coupled NFETs T1 and T2 is not large enough to overcome the increased parasitic resistance of the VCO 100, then the oscillation of the VCO 100 at operating frequency f2 is not sustained, and the oscillation in the VCO 100 stops. If so, it is said that operating frequency f2 is outside the operating frequency range of the VCO 100. Therefore, it is desirable to increase the negative resistance created by the differentially-coupled NFETs T1 and T2 so that the VCO 100 can oscillate at lower frequencies than otherwise possible. There are two methods for increasing the negative resistance created by the NFETs T1 and T2: (i) by increasing the sizes of NFETs T1 and T2, and (ii) by using the current injection circuits 140a and 140b (details below). Regarding the first method, increasing the sizes of NFETs T1 and T2 causes the parasitic resistance at nodes A and B to increase resulting in a decrease in the maximum frequency at which VCO 100 operates. The second method causes lesser parasitic resistance at nodes A and B thus increasing the upper limit of the operating frequency range of the VCO 100. The second method also extends the lower limit of the operating frequency range of the VCO 100 by providing more negative resistance to overcome extra variable capacitance (more details are below).

In one embodiment, the negative resistance created by the differentially-coupled NFETs T1 and T2 is increased by using the current-injecting circuits 140a and 140b to inject additional electric currents into the transistors T1 and T2 through nodes A and B, respectively. The inventors of the present invention have recognized that the more electric current the current-injecting circuits 140a and 140b inject into the transistors T1 and T2, respectively, the higher negative resistance the transistors T1 and T2 create. In one embodiment, each of the current-injecting circuits 140a and 140b receives a control signal Vctrl which controls the amount of electric current injected to the transistors T1 and T2.

Figure 3A:
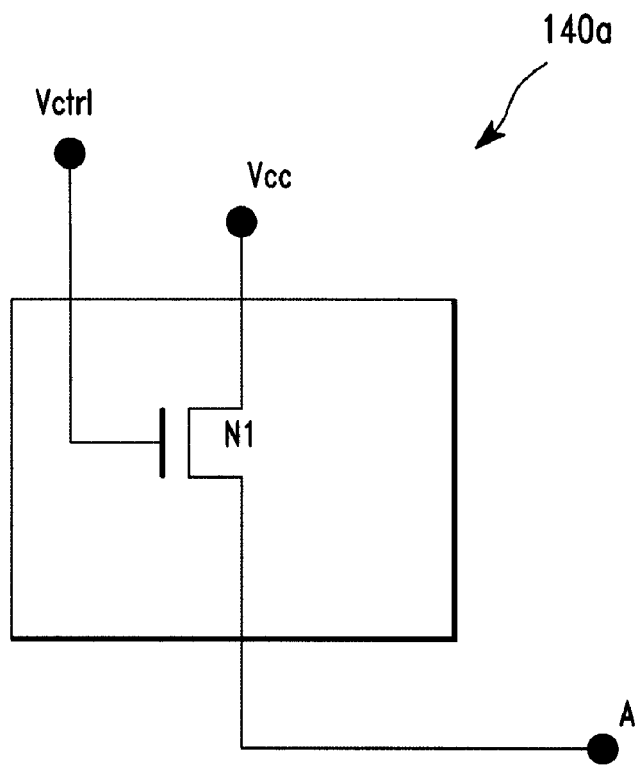

FIG. 3A illustrates an embodiment of the current-injecting circuit 140a of FIG. 1. More specifically, the current-injecting circuit 140a comprises an NFET N1 electrically coupled between Vcc (a voltage source) and node A. The gate electrode of the NFET N1 is coupled to the control signal Vctrl.

In one embodiment, with reference to FIGS. 1 and 3A, the operation of the current-injecting circuit 140a can be described as follows. To inject the maximum additional electric current into the transistor T1, control signal Vctrl is pulled high (e.g., to Vcc). As a result, the NFET N1 is completely ON and the maximum additional electric current flows through the NFET N1 into the transistor T1 via node A. This helps the transistor T1 create an additional negative resistance to the VCO 100. In contrast, to inject no additional electric current into the transistor T1, control signal Vctrl is pulled low (e.g., to ground GND). As a result, the NFET N1 is completely OFF and no additional electric current flows through the NFET N1 into the transistor T1 via node A. In other words, control signal Vctrl can be used to adjust the additional electric current injected into the transistor T1 via node A.

Figure 3B:
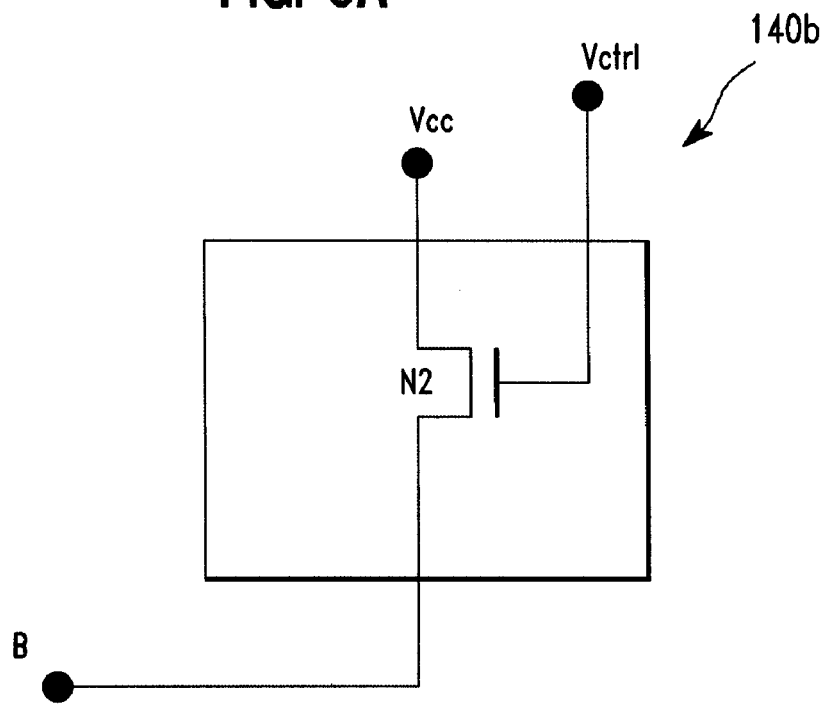

FIG. 3B illustrates an embodiment of the current-injecting circuit 140b of FIG. 1. More specifically, the current-injecting circuit 140b comprises an NFET N2 electrically coupled between Vcc (a voltage source) and node B. The gate electrode of the NFET N2 is coupled to the control signal Vctrl. The operation of the NFET N2 is similar to that of the NFET N1 as described above.

Figure 4:
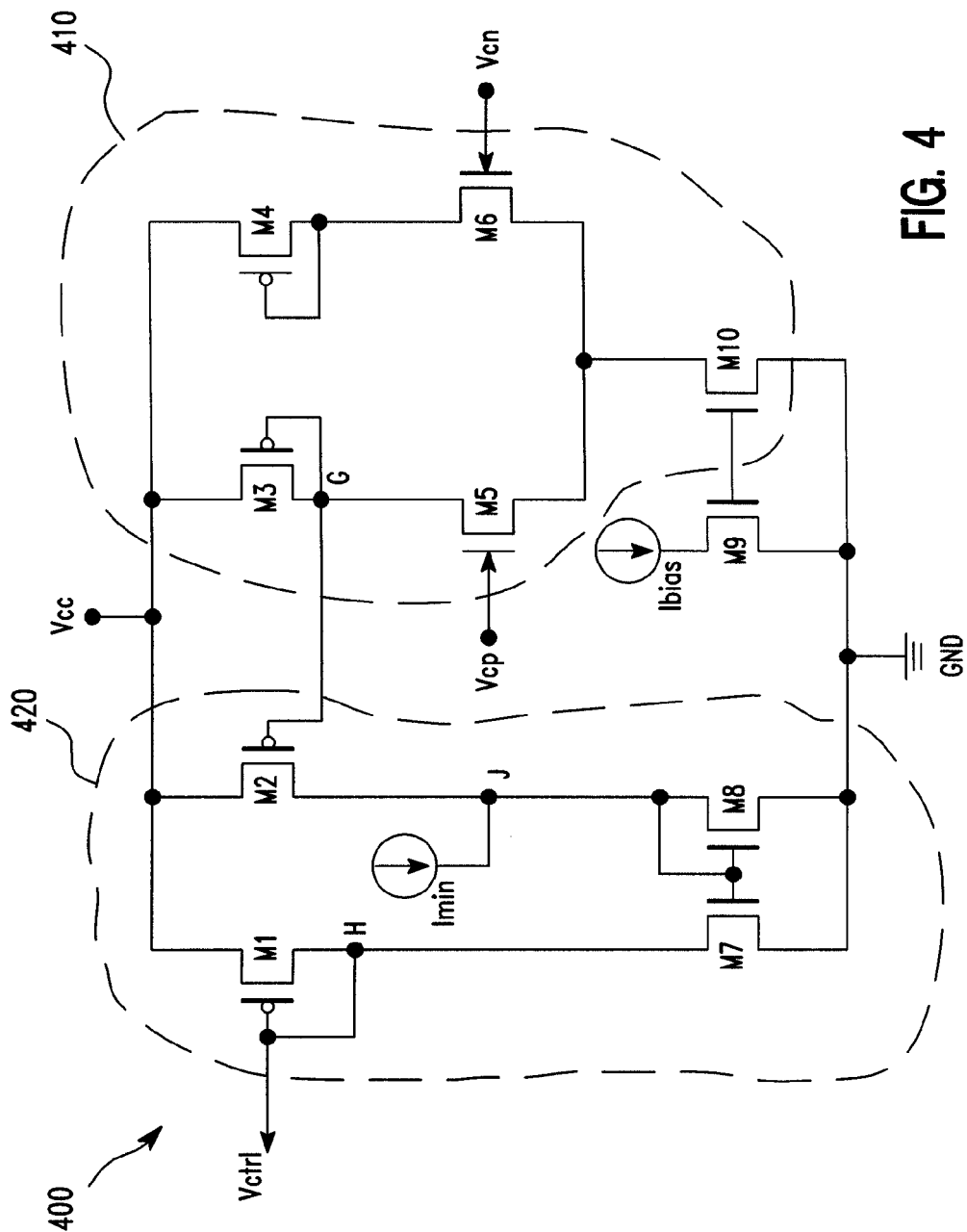
FIG. 4 shows an injection current adjusting circuit that can be used with the VCO of FIG. 1, in accordance with embodiments of the present invention.

FIG. 4 illustrates an injection current adjusting circuit 400 that can be used to generate the control signal Vctrl of FIGS. 3A-3B, in accordance with embodiments of the present invention. More specifically, in one embodiment, the injection current adjusting circuit 400 comprises 10 FETs M1-M10 coupled together as shown. The injection current adjusting circuit 400 is to adjust the control signal Vctrl to the current-injecting circuits 140a and 140b of FIGS. 3A and 3B, respectively. The operation of the injection current adjusting circuit 400 is such that whenever the capacitance of the variable capacitor 120 is increased (indicating an intent of the operator of the VCO 100 (FIG. 1) to operate the VCO 100 at a lower operating frequency), the injection current adjusting circuit 400 adjusts the control signal Vctrl accordingly to help the current-injecting circuits 140a and 140b of FIGS. 3A and 3B create more negative resistance so as to help sustain the operation (i.e., oscillation) of the VCO 100 (FIG. 1) at that lower operating frequency.

More specifically, in one embodiment, the operation of the injection current adjusting circuit 400 is as follows. As an example, assume the VCO 100 is operating at operating frequency f1. Then, assume further that in order to operate the VCO 100 at operating frequency f2 (f2<f1), the difference between Vcp and Vcn (i.e., Vcp−Vcn) is decreased, resulting in an increase in the capacitance of the variable capacitor 120. Because the differential amplifying circuit 410 (comprising FETs M3, M4, M5, M6, and M19) receives as inputs the signals Vcp and Vcn, the decrease of the difference between Vcp and Vcn results in a voltage increase at node G of the differential amplifying circuit 410. This in turn results in an increase of the electric current flowing through the FET M2 (because node G is coupled to the gate electrode of FET M2). Because the FETs M1, M2, M7, and M8 form a current mirror circuit 420, the increase of the electric current flowing through the FET M2 results in an increase in electric current flowing through NFET M1. This in turn pulls higher the voltage of node H of the current mirror circuit 420. In other words, control signal Vctrl is pulled higher.

In short, in response to the decrease of the difference between Vcp and Vcn, the injection current adjusting circuit 400 pulls higher the control signal Vctrl. In response, the current-injecting circuits 140a and 140b inject more electric currents into the differentially-coupled NFETs T1 and T2, respectively, so as to create more negative resistance to overcome the increase in parasitic resistance due to the capacitance increase of the variable capacitor 120. As a result, the operation (i.e., oscillation) of the VCO 100 is sustained at operating frequency f2.

Conversely, if the VCO 100 is to operate at an operating frequency f3 (f3>f1), then the difference between Vcp and Vcn (i.e., Vcp−Vcn) is increased, resulting in a decrease in the capacitance of the variable capacitor 120. In response to the increase of the difference between Vcp and Vcn, the injection current adjusting circuit 400 pulls lower the control signal Vctrl. In response, the current-injecting circuits 140*a* and 140*b* inject less electric currents into the differentially-coupled NFETs T1 and T2 so as to cause the differentially-coupled NFETs T1 and T2 to create less (but still sufficient) negative resistance to overcome the reduced parasitic resistance due to the capacitance decrease of the variable capacitor 120. As a result, the operation (i.e., oscillation) of the VCO 100 is sustained at operating frequency f3 with lesser power consumption by the current-injecting circuits 140*a* and 140*b*.

It should be noted that if the control signal Vctrl is pulled high (i.e., Vcc) all the time, the current-injecting circuits 140*a* and 140*b* of FIGS. 3A and 3B would inject the maximum additional electric currents into the transistor T1 and T2 (FIG. 1) all the time, whereas it does not require that much additional electric currents to sustain the operation of the VCO 100. As a result, pulling control signal Vctrl high all the time is functional, but not optimum.

In summary, with reference to FIG. 1, by injecting additional electric currents into the differentially-coupled NFETs T1 and T2, the operating frequency range of the VCO 100 is broadened. In addition, by injecting just enough additional electric currents into the differentially-coupled NFETs T1 and T2 (with the help of the injection current adjusting circuit 400 of FIG. 4), the operation of the VCO 100 is sustained at these lower frequencies with the minimum power consumption by the differentially-coupled NFETs T1 and T2 and the FETs N1 and N2 (FIG. 3). The lower the operating frequency, the larger the additional electric currents injected into the differentially-coupled NFETs T1 and T2. In other words, the additional electric currents injected into the differentially-coupled NFETs T1 and T2 are inversely proportional to the change in the operating frequency of the VCO 100.

With reference to FIG. 4, it should be noted that the current source Ibias provides an electric current through FET M9 so as to set up a bias for the operation of the differential amplifying circuit 410.

In one embodiment, a current source Imin injects an electric current to node J of the current mirror circuit 420 so as to ensure that the electric current flowing through FET M1 is at least Imin. This results in control signal Vctrl being at least a voltage level corresponding to the minimum current Imin. In short, a minimum value for Vctrl can be specified by setting the appropriate value for Imin. Keeping Vctrl above a minimum value ensures that the differentially-coupled NFETs T1 and T2 (FIG. 1) create at least a minimum negative resistance, and therefore, ensures that the VCO 100 (FIG. 1) can operate down to a desired operating frequency.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. An oscillation circuit, comprising:
    (a) an LC oscillator including an inductor and a variable capacitor electrically coupled together, wherein the inductor and the variable capacitor are configured such that if the variable capacitor charges/discharges, then at least a portion of the charge/discharge electric current of the variable capacitor flows through the inductor;
    (b) first and second differentially-coupled transistors (i) electrically coupled to the LC oscillator and (ii) configured to provide negative resistance to the LC oscillator;
    (c) a first current-injecting circuit (F) electrically coupled to the first differentially-coupled transistor and (ii) configured to inject a first additional electric current into the first differentially-coupled transistor so as to cause the first differentially-coupled transistor to create a first additional negative resistance to the LC oscillator, wherein the first differentially-coupled transistor is configured to receive a first original electric current other than the first additional electric current; and
    (d) an injection current adjusting circuit (i) electrically coupled to the LC oscillator and the first current-injecting circuit, and (ii) configured to cause the first current-injecting circuit to inject the first additional electric current into the first differentially-coupled transistor in response to a frequency change of the LC oscillator, wherein the first additional electric current is inversely proportional to the frequency change.

2. The oscillation circuit of claim 1, wherein the injection current adjusting circuit comprises (i) a differential amplifying circuit electrically coupled to the LC oscillator and (ii) a current mirror circuit electrically coupling the differential amplifying circuit to the first current-injecting circuit, wherein the differential amplifying circuit is configured to sense a change in capacitance of the variable capacitor, and wherein the current mirror circuit is configured to cause the first current-injecting circuit to generate the first additional electric current in response to the differential amplifying circuit sensing the change, the first additional electric current being proportional to the change.

3. The oscillation circuit of claim 1, wherein the injection current adjusting circuit is configured to control the first current-injecting circuit such that the first additional electric current is at least a pre-specified value.

4. An oscillation circuit, comprising:
    (a) an LC oscillator including an inductor and a variable capacitor electrically coupled together, wherein the inductor and the variable capacitor are configured such that if the variable capacitor charges/discharges, then at least a portion of the charge/discharge electric current of the variable capacitor flows through the inductor;
    (b) first and second differentially-coupled transistors (i) electrically coupled to the LC oscillator and (ii) configured to provide negative resistance to the LC oscillator; and
    (c) a first current-injecting circuit (i) electrically coupled to the first differentially-coupled transistor and (ii) configured to inject a first additional electric current into the first differentially-coupled transistor so as to cause the first differentially-coupled transistor to create a first additional negative resistance to the LC oscillator, wherein the first differentially-coupled transistor is configured to receive a first original electric current other than the first additional electric current;
    (d) a second current-injecting circuit (i) electrically coupled to the second differentially-coupled transistor and (ii) configured to inject a second additional electric current into the second differentially-coupled transistor so as to cause the second differentially-coupled transistor to create a second additional negative resistance to the LC oscillator, wherein the second differentially-coupled transistor is configured to receive a second original electric current other than the second additional electric current, wherein the first current-injecting circuit comprises a transistor, and wherein the second current-injecting circuit comprises a transistor; and
    (e) an injection current adjusting circuit (i) electrically coupled to the LC oscillator and the first and second current-injecting circuits, and (ii) configured to cause the first and second current-injecting circuits to inject the first and second additional electric currents into the first and second differentially-coupled transistors, respectively, in response to a frequency change of the LC oscillator, wherein the first and second additional electric currents are inversely proportional to the frequency change.

5. The oscillation circuit of claim 4,
wherein the injection current adjusting circuit comprises (i) a differential amplifying circuit electrically coupled to the LC oscillator and (ii) a current mirror circuit electrically coupling the differential amplifying circuit to the first and second current-injecting circuits,
wherein the differential amplifying circuit is configured to sense a change in capacitance of the variable capacitor, and
wherein the current mirror circuit is configured to cause the first and second current-injecting circuits to generate the first and second additional electric currents, respectively, in response to the differential amplifying circuit sensing the change, the first and second additional electric currents being proportional to the change.

6. The oscillation circuit of claim 4, wherein the injection current adjusting circuit is configured to control the first and second current-injecting circuits such that the first and second additional electric currents are at least a pre-specified value.

7. An oscillation circuit operation method, comprising:
providing an oscillation circuit, which includes (a) an LC oscillator comprising an inductor and a variable capacitor electrically coupled together, (b) first and second differentially-coupled transistors electrically coupled to the LC oscillator and configured to provide negative resistance to the LC oscillator, and (c) a first current-injecting circuit electrically coupled to the first differentially-coupled transistor;
using the first current-injecting circuit to inject a first additional electric current into the first differentially-coupled transistor so as to cause the first differentially-coupled transistor to create a first additional negative resistance to the LC oscillator, wherein the first differentially-coupled transistor is configured to receive a first original electric current other than the first additional electric current, and wherein the inductor and the variable capacitor are configured such that if the variable capacitor charges/discharges, then at least a portion of the charge/discharge electric current of the variable capacitor flows through the inductor; and
using the first current-injecting circuit to change the first additional electric current so as to change the first additional negative resistance created by the first differentially-coupled transistor,
wherein the oscillation circuit further comprises an injection current adjusting circuit electrically coupled to the LC oscillator and the first current-injecting circuit, and
wherein said using the first current-injecting circuit to change the first additional electric current comprises using the injection current adjusting circuit to cause the first current-injecting circuit to inject the first additional electric current into the first differentially-coupled transistor in response to a frequency change of the LC oscillator, wherein the first additional electric current is inversely proportional to the frequency change.

8. The method of claim 7,
wherein the injection current adjusting circuit comprises (i) a differential amplifying circuit electrically coupled to the LC oscillator and (ii) a current mirror circuit electrically coupling the differential amplifying circuit to the first current-injecting circuit,
wherein said using the first current-injecting circuit comprises:
using the differential amplifying circuit to sense a change in capacitance of the variable capacitor, and
using the current mirror circuit to cause the first current-injecting circuit to generate the first additional electric current in response to the differential amplifying circuit sensing the change, the first additional electric current being proportional to the change.

\* \* \* \* \*